United States Patent [19]

Yoshikawa

[11] Patent Number: 4,745,610
[45] Date of Patent: May 17, 1988

[54] SEMICONDUCTOR LASER DRIVE DEVICE WITH AN ABNORMAL VOLTAGE PROTECTION CIRCUIT

[75] Inventor: Shozi Yoshikawa, Tokyo, Japan

[73] Assignee: Olympus Optical Co., Ltd., Tokyo, Japan

[21] Appl. No.: 862,770

[22] Filed: May 13, 1986

[30] Foreign Application Priority Data

May 20, 1985 [JP] Japan .................. 60-108044

[51] Int. Cl.$^4$ .................................. H01S 3/00
[52] U.S. Cl. ................................ 372/38; 372/33
[58] Field of Search .......................... 372/33, 38, 29

[56] References Cited

U.S. PATENT DOCUMENTS 3,898,583 8/1975 Shuey .............................. 372/33
4,238,707 12/1980 Malissin et al. ................. 372/38

FOREIGN PATENT DOCUMENTS 56-144590 11/1981 Japan ............................. 372/38
0161157 9/1983 Japan ............................. 372/38

Primary Examiner—James W. Davie
Assistant Examiner—B. Randolph
Attorney, Agent, or Firm—Frishauf, Holtz, Goodman & Woodward

[57] ABSTRACT

A plurality of supply voltages are supplied form a power supply to a semiconductor laser drive device. One of these supply voltages is applied to a discrimination circuit. The discrimination circuit includes a first zener diode, to which one of the supply voltages is applied, and which has a zener breakdown voltage corresponding to the lower limit of a threshold voltage range, and a second zener diode, to which the same supply voltage is applied, and which has a zener breakdown voltage corresponding to the upper limit of the threshold voltage range. First and second light-emitting diodes are connected in series with the respective first and second zener diodes. Light emitted from the first and second light-emitting diodes is received by respective first and second phototransistors connected in series between a voltage supply terminal and a ground terminal. A resistor is connected in parallel with the second phototransistor connected to the ground terminal. Voltage at the connection point between the first and second phototransistors is applied to the gate of a junction field-effect transistor, which has its drain grounded and its source connected to a control terminal of a switch in parallel with and for shunting the semiconductor laser.

7 Claims, 7 Drawing Sheets

SEMICONDUCTOR LASER DRIVE DEVICE WITH AN ABNORMAL VOLTAGE PROTECTION CIRCUIT

BACKGROUND OF THE INVENTION

This invention relates to a semiconductor laser drive device.

The semiconductor laser has excellent features that it is small in size, has high light emission efficiency and is capable of direct modulation. On the demerit side, however, it is sensitive to variations of the drive voltage and is fragile with respect to the application of an inverse or excessive voltage (drive voltage).

For these reasons, the prior art semiconductor laser drive device is provided with various protective functions. Such a prior art device is disclosed in, for instance, Japanese Patent Laid-Open No. 56-144,590. This prior art device, however, is provided mainly with means for the protection from a spike voltage upon application of a pulse voltage for modulating a laser beam from the semiconductor laser, or for stabilization of the laser output with respect to variations of the drive voltage. In other words, no substantial importance is attached to the protection with respect to the application of an inverse or excessive voltage.

When the semiconductor laser is used in a complicated system, it is connected to a power supply section or a control section via a cable or a connector. Thus, it can be readily installed and removed in case of assembling, testing and adjusting. When the semiconductor laser is removed from the power source section or control section, an inverse or excessive voltage is liable to be applied to it. Such inverse or excessive voltage has to be removed.

For this reason, the operation of the semiconductor laser drive device is controlled using a voltage discrimination circuit as shown in FIGS. 1A and 1B. In this arrangement, one of supply voltages to the semiconductor laser drive device is used as voltage to be discriminated 103 and compared to a reference voltage in comparator 101. The reference voltage is obtained as a division of another one 102 of supply voltages through a voltage divider consisting of resistors 104 and 105. Output 106 of comparator 101 is used as control signal for controlling the semiconductor laser drive device. In the case shown in FIG. 1A, the ground potential of voltage 103 is the same as the ground potential of the reference voltage. In the case shown in FIG. 1B, there is common mode noise 132 between the ground potential of voltage 103 and ground potential of the reference voltage. Reference numeral 131 in FIG. 1B designates equivalent voltage source of voltage 103.

With the above circuit, when voltage 103 has the opposite polarity or has a level in excess of a predetermined level, the operation of the semiconductor laser drive device is inhibited according to output 106 of comparator 101 to prevent the drive voltage from being applied to the semiconductor laser.

Such a voltage discrimination circuit, however, is a closed loop circuit. Therefore, when there is common mode noise 132 between voltage 103 and comparator 101 as shown in FIG. 1B, an excess common mode input is fed to comparator 101 to cause rupture thereof or detection sensitivity reduction thereof.

SUMMARY OF THE INVENTION

An object of the invention is to provide a semiconductor laser drive device, which can protect the semiconductor laser by preventing an abnormal voltage from being applied thereto when the power source voltage is varied to be outside a proper voltage range.

Another object of the invention is to provide a semiconductor laser drive device, which can prevent rupture or detection sensitivity reduction of the power source voltage discrimination circuit due to a common mode noise.

According to the invention, there is provided a semiconductor laser drive device, which comprises a semiconductor laser driver, a discrimination circuit for detecting whether at least one of power source voltages supplied to the semiconductor laser driver is within a predetermined voltage range, a light-emitting element for emitting light when the discrimination circuit detects that at least one of power source voltages is in the predetermined voltage range, a photoelectrical converter for converting light emitted from the lightemitting element, and a controller for controlling the operation of the semiconductor laser driver according to the output of the photoelectrical converter.

DETAILED DESCRIPTION OF THE PREFERRED EMBODIMENTS

Preferred embodiments of the semiconductor laser drive device according to the invention will be described with reference to the drawings.

Figure 1A:
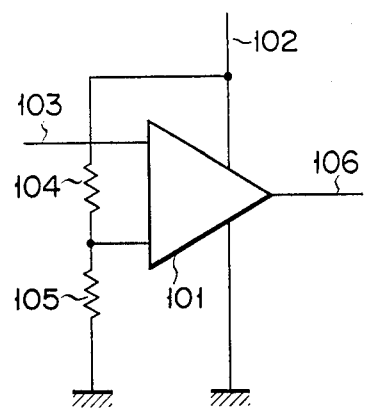
FIGS. 1A and 1B are circuit diagrams showing a prior voltage discrimination circuit for a semiconductor laser drive device.
Figure 1B:
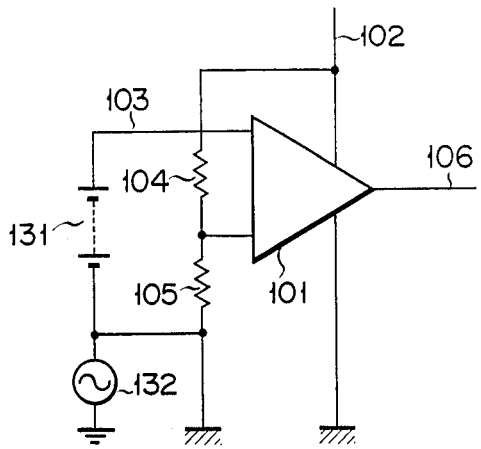
Figure 2:
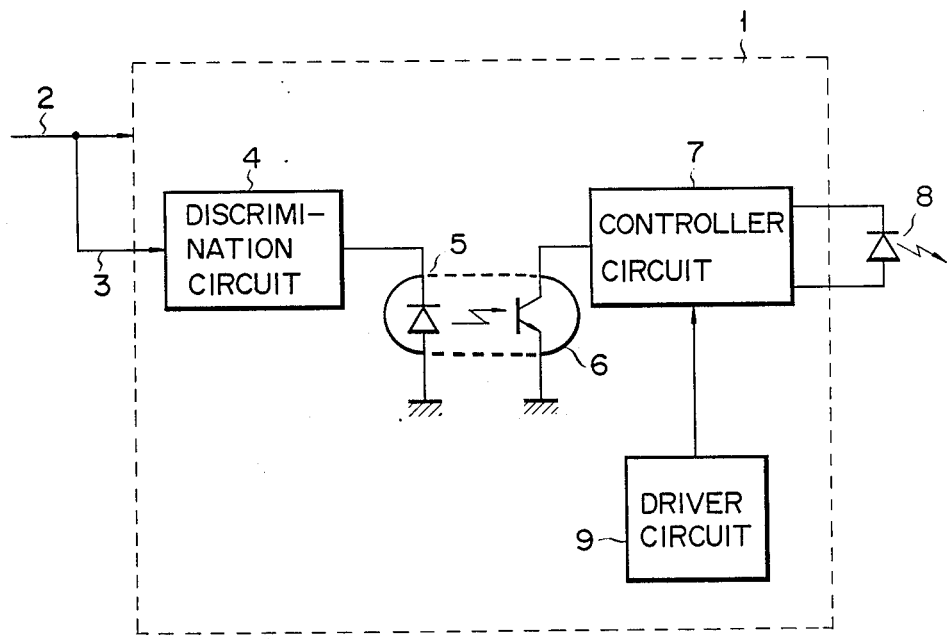
FIG. 2 is a block diagram showing a first embodiment of the semiconductor laser drive device according to the invention.

FIG. 2 is a block diagram showing a first embodiment. Drive device 1 is supplied with a plurality of supply voltages 2 (e.g., ±5 V and ±12 V) from a power supply (not shown). At least one of supply voltages, i.e., supply voltage 3, is fed to discrimination circuit 4. Discrimination circuit 4 determines whether the input supply voltage 3 is within a predetermined threshold voltage range. If the input voltage 3 is within the threshold voltage range, circuit 4 causes a current corresponding to the input voltage to flow through LED (light-emitting diode) 5. If the input voltage 3 is not within the threshold voltage range, it causes no current to flow through LED 5. LED 5 constitutes a photocoupler together with phototransistor 6.

Phototransistor 6 has its emitter grounded and its collector connected to controller circuit 7. In controller circuit 7, the emitter-collector voltage across phototransistor 6 is amplified through a high input impedance amplifier. The resultant amplified signal controls a logic circuit element to either allow or prohibit the passage of drive current supplied from driver circuit 9 to semiconductor laser 8.

Figure 3:
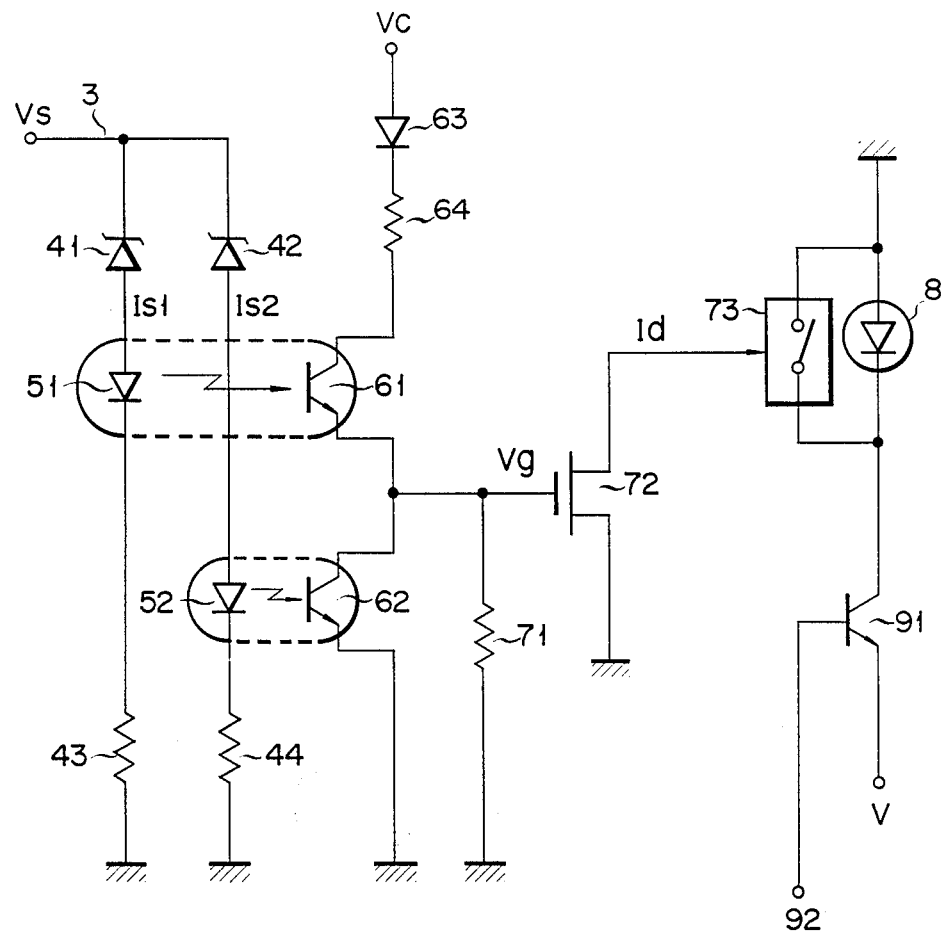
FIG. 3 is a circuit diagram showing a specific circuit construction of the first embodiment.

FIG. 3 is a circuit diagram showing a specific circuit construction of the first embodiment shown in FIG. 2. Voltage 3 (voltage Vs) among the plurality of supply voltages 2 is fed to the cathode of each of zener diodes 41 and 42. Zener diodes 41 and 42 have different zener breakdown voltages, the zener breakdown voltage of the former being lower than that of the latter. The zener breakdown voltage of zener diode 41 corresponds to the proper value of input voltage Vs, while the zener breakdown voltage of the zener diode 42 corresponds to the maximum permissible value of voltage Vs. Zener diodes 41 and 42 have their anodes connected to the anodes of respective LEDs 51 and 52. LEDs 51 and 52 have their cathodes grounded through respective current-limiting resistors 43 and 44. LEDs 51 and 52 form respective photocouplers together with corresponding phototransistors 61 and 62.

The emitter of phototransistor 61 is connected to the collector of phototransistor 62, and the emitter of phototransistor 62 is grounded. The collector of phototransistor 61 is connected through resistor 64 and reverse current blocking diode 63 to the terminal, to which supply voltage Vc is applied. Supply voltage Vc, like input voltage Vs, is one of the plurality of supply voltages supplied from the power supply (not shown). The connection point between phototransistors 61 and 62 is grounded through resistor 71 and is also connected to the gate of JFET (p-channel junction field-effect transistor) 72. JFET 72 has its drain grounded and its source connected to a control terminal of switch 73. Switch 73 is connected in parallel with semiconductor laser 8. Semiconductor laser 8 has one terminal grounded and the other terminal connected through the collector-emitter path of driver transistor 91 to a terminal, to which supply voltage V is applied. Supply voltage V is also one of the plurality of supply voltages supplied from the power supply (not shown). Modulation signal 92 is supplied to the base of driver transistor 91 to modulate laser beam emitted from semiconductor laser 8.

Figure 4:
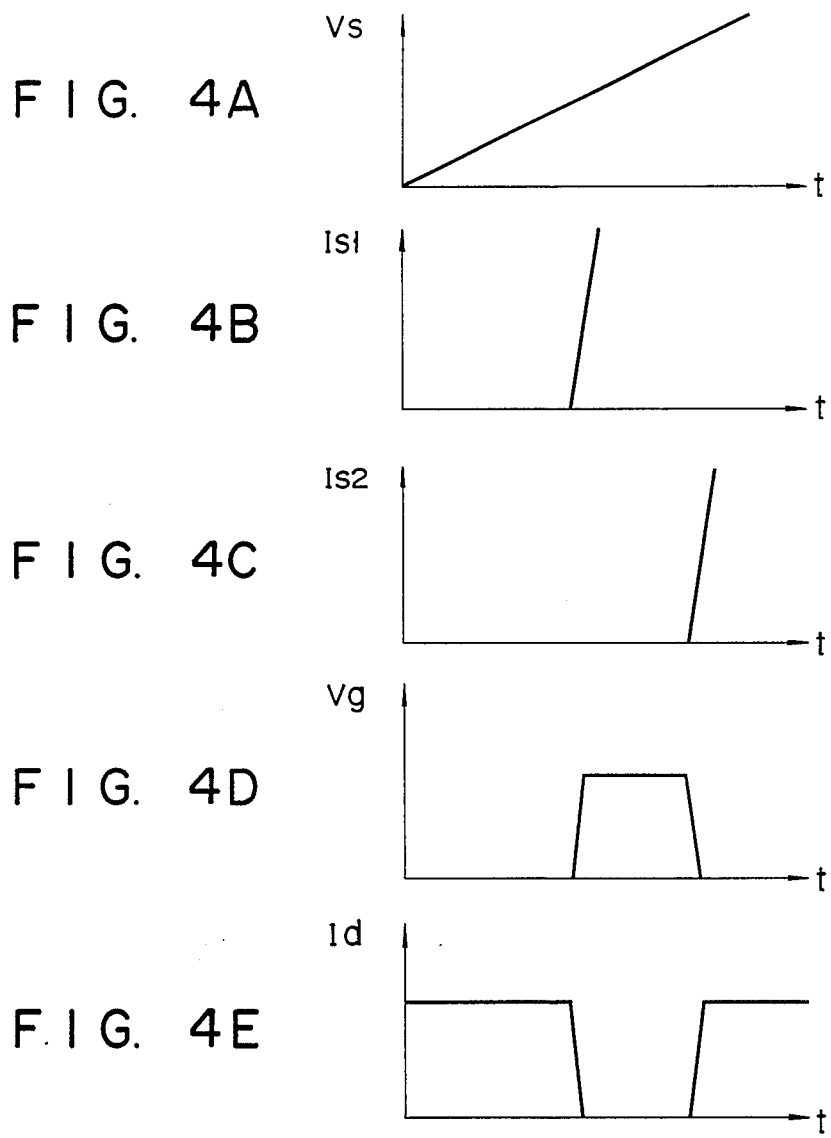
FIGS. 4A to 4E are signal waveform diagrams illustrating the operation of the first embodiment.

The operation of the circuit shown in FIG. 3 will now be described with reference to FIGS. 4A to 4E. When the operation is started (i.e., when a power switch is closed), supply voltage Vs starts to rise as shown in FIG. 4A. When supply voltage Vs reaches a predetermined value, zener diode 41 is turned on. At this time, current $I_{s1}$ is caused through LED 51 as shown in FIG. 4B. LED 51 thus emits light. Current $I_{s1}$ is limited by current-limiting resistor 43.

Figure 5:
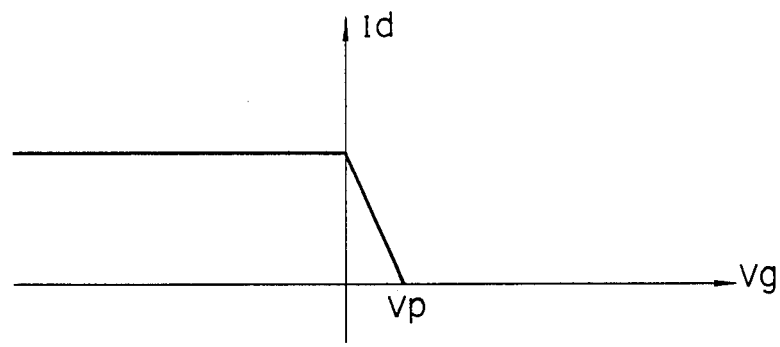
FIG. 5 is a graph showing the relation between the gate voltage and drain current in a field-effect transistor in the first embodiment.

With light emitted from LED 51, phototransistor 61 is turned on, so that the terminal, to which supply voltage Vc is applied, is electrically connected to the ground terminal through diode 63, resistor 64, phototransistor 61 and resistor 71. As a result, gate voltage Vg on JFET 72, which has been at the ground potential through resistor 71, rises to a voltage which corresponds to a division of supply voltage Vc by the resistance of the series combination of diode 63, resistor 64 and phototransistor 61 and resistor 71 as shown in FIG. 4D. Gate voltage Vg and drain current Id of JFET 72 are related to each other as shown in FIG. 5. Therefore, when gate voltage Vg has been the ground potential, JFET 72 has been "on" and carrying drain current Id as shown in FIG. 4E. When gate voltage Vg exceeds channel pinch-off voltage Vp, however, JFET 72 is turned off, so that drain current Id (which is a control current supplied to switch 73) is reduced to zero.

While control current Id has been flowing, switch 73 has been "on", shunting semiconductor laser 8. With the vanishment of control current Id, switch 73 is turned off to release the shunting of semiconductor laser 8. Subsequently, the intensity of the laser beam from semiconductor laser 8 is controlled (modulated) according to the collector current in drive transistor 91 which is on-off operated (modulated) according to modulation signal 92.

When supply voltage Vs becomes excessive, zener diode 42 also is turned on. Current $I_{s2}$ is caused to flow through LED 52 as shown in FIG. 4C causing LED 52 to emit light. Current $I_{s2}$ is limited by current-limiting resistor 44. When phototransistor 62 is turned on by light emitted from LED 52, gate voltage Vg on JFET 72 is reduced to ground potential through phototransistor 62, as shown in FIG. 4D. JFET 72 thus is switched from the channel pinch-off state to the "on" state to increase drain current Id of JFET 72 (i.e., control current supplied to switch 73). Switch 73 thus is closed to shunt semiconductor laser 8. Subsequently, laser beam emission from semiconductor laser 8 is inhibited irrespective of modulation signal 92.

When supply voltage Vs becomes excessive, supply voltage V is liable to become excessive too. In this case, however, the laser beam emission from semiconductor laser 8 is inhibited, thus preventing rupture of semiconductor laser 8 due to possible application of an excessive voltage.

Strictly speaking, the resistance of resistor 64 is set to be very low compared to the resistance of resistor 71 but higher than the ratio of voltage Vc supplied to the collector of phototransistor 61 to control current Id.

As has been shown, in the first embodiment semiconductor laser 8 is shunted and released from the shunt using JFET 72, which is turned on and off according to supply voltage Vc. Thus, the on-off operation of JFET 72 is never influenced by variations of supply voltage Vc, so that it is possible to prevent an excessive voltage or an inverse voltage from being applied to semiconductor laser 8. More specifically, when both phototransistors 61 and 62 are "off", JFET 72 is turned on without being influenced by variations of supply voltage Vc for its gate is grounded through resistor 71. When phototransistor 61 alone is "on", JFET 72 is kept off with increase of supply voltage Vc. In this case, normal discrimination results can be obtained continually. When supply voltage Vc becomes lower than the pinch-off voltage Vp, JFET 72 is turned on to increase current Id. This state is the same as the abnormal state, and semiconductor laser 8 is thus shunted to prevent application thereto of an excessive voltage. When both phototransistors 61 and 62 are "on", the gate of JFET 72 is grounded through phototransistor 62. Thus, in this case, like the case when both phototransistors 61 and 62 are "off", JFET 72 is turned on without being influenced by variations of supply voltage Vc.

Description relating to the common mode noise will be described.

Figure 6:
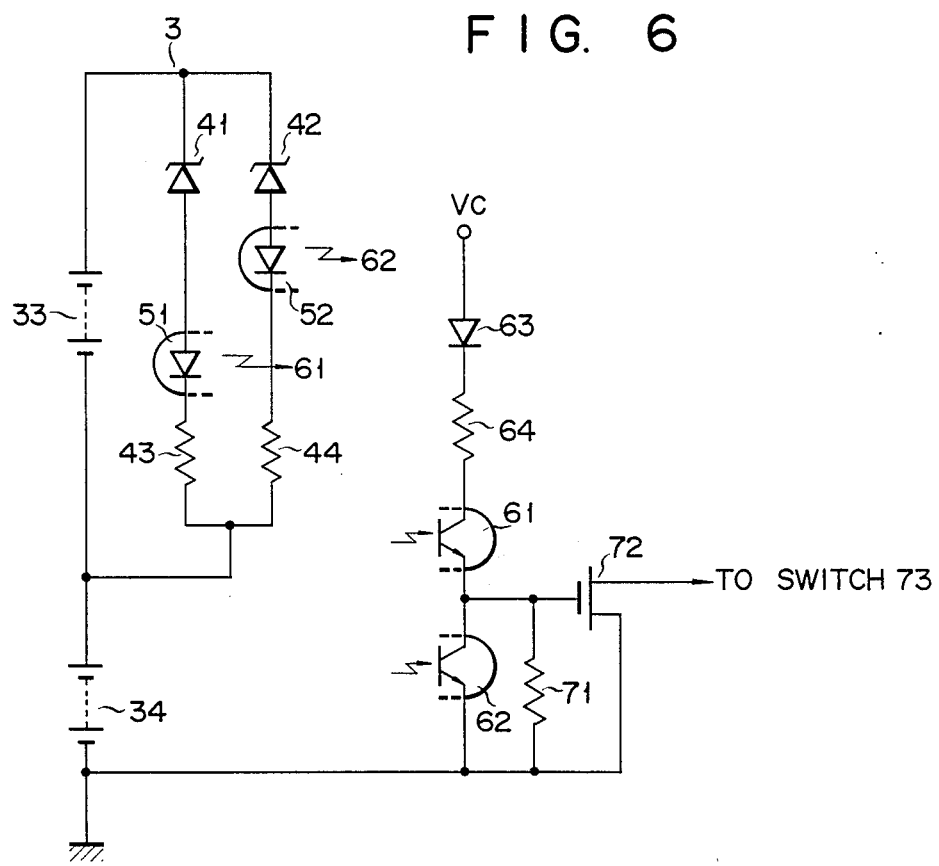
FIG. 6 is a circuit diagram showing an equivalent circuit of the first embodiment which includes the common mode noise.

FIG. 6 is a circuit diagram showing an equivalent circuit of the first embodiment which includes the common mode noise. In this instance, supply voltage 3 is supplied from power supply 33. A series circuit consisting of zener diode 41, LED 51 and current-limiting resistor 43 and a series circuit consisting of a zener diode 42, LED 52 and current-limiting resistor 44 are connected in parallel with power supply 33. There is common mode noise supply 34 between a power supply system for zener diodes 41 and 42, LEDs 51 and 52 and current-limiting resistors 43 and 44 and a power supply system for phototransistors 61 and 62, diode 63 and current-limiting resistor 64. More specifically, current-limiting resistors 43 and 44 and positive terminal of common mode noise supply 34 are connected to the negative terminal of power supply 33, and the negative terminal of common mode noise supply 34 is grounded along with the emitter of phototransistor 62.

The series circuit consisting of zener diode 41, LED 51 and current-limiting resistor 43 and the series circuit consisting zener diode 42, LED 52 and current-limiting resistor 44, although they each constitute a closed loop circuit with respect to supply voltage power supply 33, each constitute an open loop circuit with respect to common mode noise supply 34. Therefore, there is no possibility of erroneous operation of LEDs 51 and 52 due to common mode noise. Further, the circuit consisting of phototransistors 61 and 62, diode 63 and current-limiting resistor 64 is only optically coupled by a photocoupler to common mode noise supply 34, but it is not electrically connected thereto. Thus, there is again no possibility of application of an excessive voltage due to common mode noise to the circuit consisting of phototransistors 61 and 62, diode 63 and current-limiting resistor 64.

Figure 7:
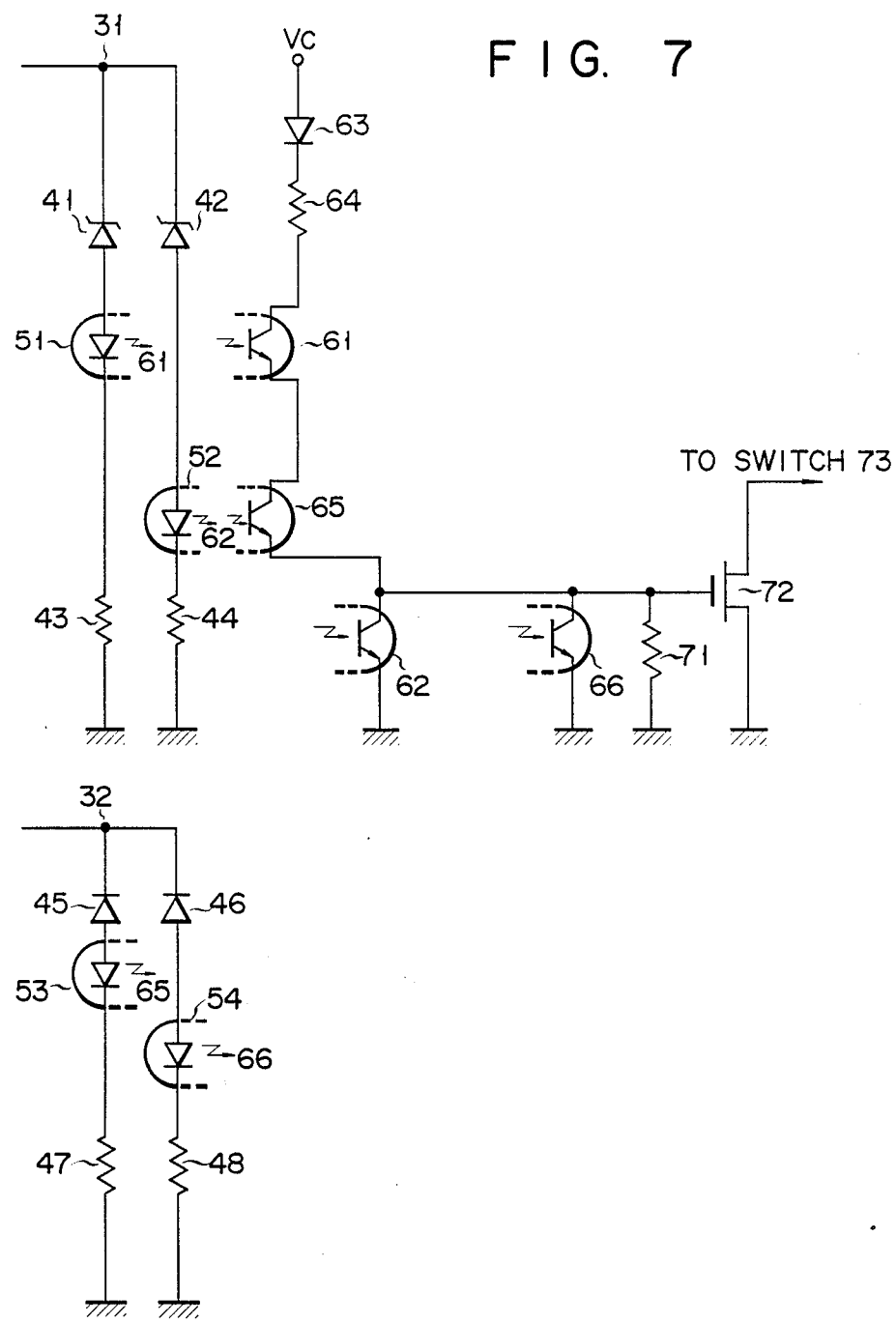
FIG. 7 is a circuit diagram showing a second embodiment of the semiconductor laser drive device according to the invention.

FIG. 7 is a circuit diagram showing a second embodiment. This embodiment can cope with a plurality of supply voltages 31, 32. First supply voltage 31 is processed in the same manner as with supply voltage 3 in the first embodiment. Second supply voltage 32, like first supply voltage 31, is applied to the cathode of each of zener diodes 45 and 46. The zener breakdown voltage of zener diode 45 is lower than that of zener diode 46. The anodes of zener diodes 45 and 46 are connected to the anodes of respective LEDs 53 and 54, which have their cathodes grounded through current-limiting resistors 47 and 48. LEDs 53 and 54 constitute respective photocouplers with corresponding phototransistors 65 and 66.

Unlike the first embodiment, phototransistor 65 is serially connected between phototransistors 61 and 62, and phototransistor 66 is connected in parallel with phototransistor 62. The rest of the construction is the same as in the case of FIG. 3.

In this embodiment, when both supplied voltages 31 and 32 exceed a proper voltage, LEDs 51 and 53 are caused to emit light to turn on phototransistors 61 and 65. As a result, the gate voltage on JFET 72 becomes positive, thus cutting off control current Id. In this way, semiconductor laser 8 is released from the shunt as in the first embodiment. The laser beam emission is controlled according to modulation signal 92.

When at least either one of supply voltages 31 and 32 exceeds a maximum permissible level, at least one of LEDs 52 and 54 is caused to emit light to turn on at least one of phototransistors 62 and 66. As a result, the gate voltage on JFET 72 goes back to the ground potential. JFET 72 thus is released from the pinch-off, thus increasing control current Id. Semiconductor laser 8 thus is shunted again, that is, laser beam emission is inhibited.

This embodiment can also cope with three or more supply voltages, and all the supply voltages supplied to the semiconductor laser drive device may be discriminated.

Figure 8:
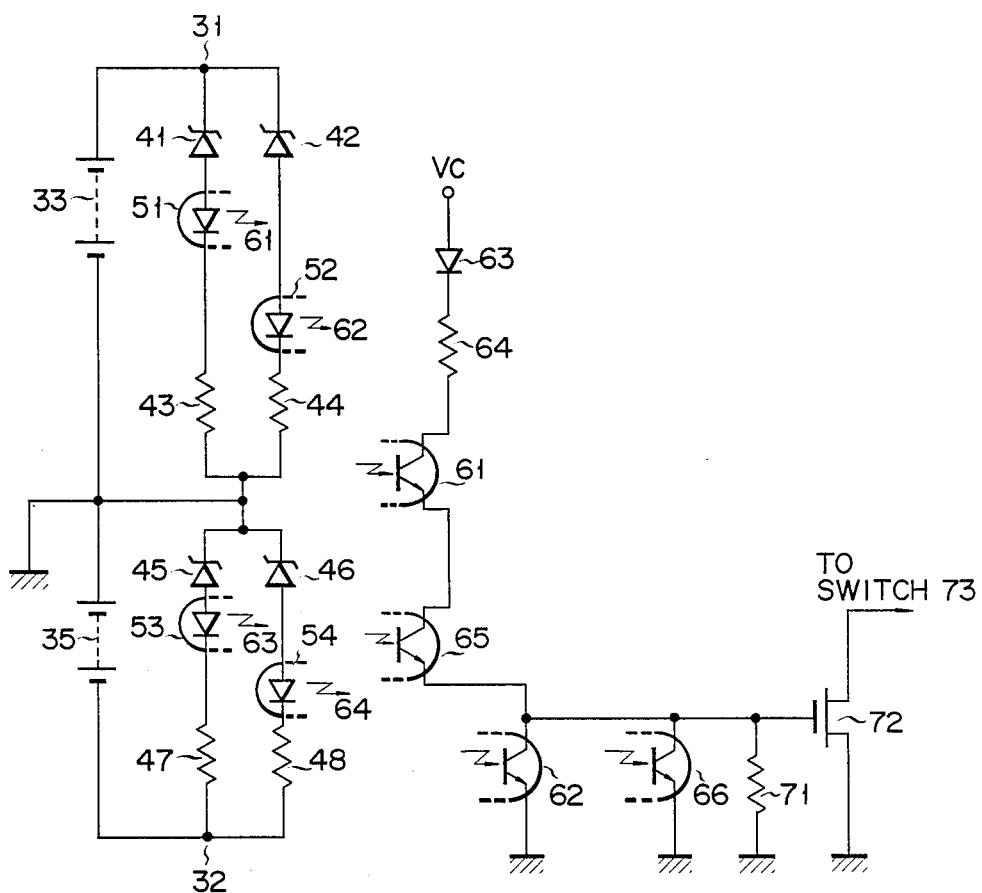
FIG. 8 is a circuit diagram showing a third embodiment of the semiconductor laser drive device according to the invention.

FIG. 8 is a circuit diagram showing a third embodiment. In this embodiment, two supply voltages 31 and 32 in the third embodiment shown in FIG. 7 are respectively positive and negative voltages with respect to a common ground potential.

Figure 9:
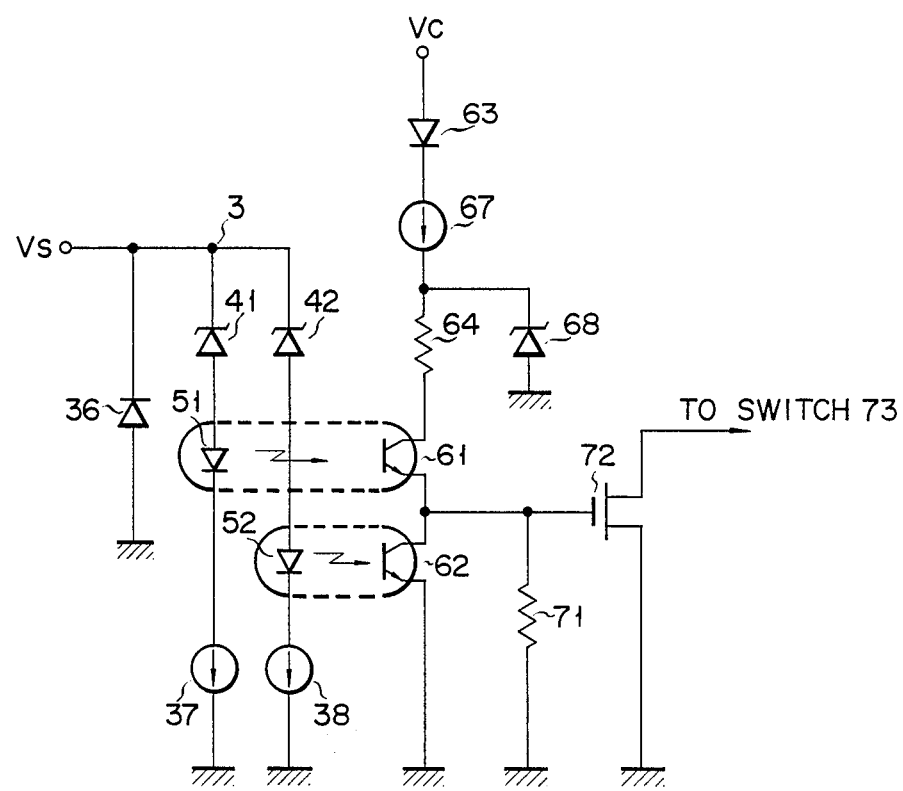
FIG. 9 is a circuit diagram showing a fourth embodiment of the semiconductor laser drive circuit according to the invention.

FIG. 9 is a circuit diagram showing a fourth embodiment. This embodiment is a modification of the first embodiment. In this embodiment, current limiters 37 and 38 are connected in lieu of current-limiting resistors 43 and 44 to the cathodes of LEDs 51 and 52, and reverse voltage blocking diode 36 is connected between a terminal, to which supply voltage Vc is applied, and ground. Further, current limiter 67 is connected between collector resistor 64 of phototransistor 61 and reverse voltage blocking diode 63. Further, reverse voltage blocking diode 68 is connected between the connection point between collector resistor 64 and current limiter 67 and ground. Current limiters 37, 38 and 67 may each be a constant current source using FETs. In case where current-limiting resistors are used, current increases with voltage increase. Therefore, rupture of elements is prone in case when an excessive voltage is applied. In contrast, current limiters 37 and 38 will never cause current in excess of a predetermined permissible current even when supply voltage 3 is extraordinarily increased. It is thus possible to prevent rupture of zener diodes 41 and 42 and LEDs 51 and 52 due to an excessive current. Current limiter 67 also serves to protect phototransistors 61 and 62 from an excessive current.

As has been described in the foregoing, according to the invention it is possible to provide a semiconductor laser drive device, which can effectively protect a semiconductor laser in case of supply voltage variations due to a common mode noise or the like.

In the above embodiments zener diodes have been used as voltage discrimination elements. However, it is possible to use SCRs or the like as well. Further, the supply voltage may be compared with one of the minimum and maximum permissible values instead of the permissible range and the abnormal condition may be discriminated when the supply voltage is below or over the minimum or maximum permissible values.

What is claimed is:

1. A semiconductor laser device, comprising:
semiconductor laser driver means for causing a semiconductor laser to emit a laser beam;
discriminating means for detecting whether at least one power source voltage of different power source voltages supplied to said semiconductor laser driver means is within a predetermined voltage range:
means for emitting coherent or non-coherent light when said discriminating means detects that said at least one power source voltage is in said predetermined voltage range;
light converting means for photo-electrically converting a light level emitted from said means for emitting light, and for producing an output representing the level of said at least one power source voltage; and control means coupled to said light converting means for inhibiting the laser beam emitting operation of said semiconductor laser driver means when the output of said light converting means represents a level outside said predetermined voltage range.

2. A semiconductor laser device according to claim 1, in which said control means includes a junction field-effect transistor for being turned on and off according to the output of said light converting means, and means for inhibiting laser beam emission of the semiconductor laser according to the on-off operation of said transistor.

3. A semiconductor laser device according to claim 2, in which said control means includes means for shunting said semiconductor laser according to the on-off operation of said junction field-effect transistor.

4. A semiconductor laser device according to claim 1, in which said discriminating means includes N, wherein N is a positive integer not less than 2, pairs of zener diodes, to which N power source voltages supplied to said semiconductor laser driver means are applied, and each pair of zener diodes has respective zener breakdown voltages corresponding to the minimum and maximum permissible values of each of said N supply voltages; said means for emitting light includes N pairs of light-emitting elements connected in series with said respective zener diodes; said light converting means includes N pairs of photo-electric conversion elements connected in series between a voltage supply terminal and a ground terminal, for receiving light from said respective light-emitting elements; and said control means includes a junction field-effect transistor with the gate thereof connected to a connection point between said photo-electric conversion elements, and means for shunting said semiconductor laser according to the on-off operation of said junction field-effect transistor.

5. A semi-conductor laser device according to claim 4, including N pairs of first current limiting means connected in series with respective ones of said zener diodes and light-emitting elements, and N pairs of second current limiting means connected in series with respective ones of said photo-electric conversion elements.

6. A semiconductor laser device according to claim 1, in which said means for detecting includes first and second zener diodes, to which a first one of a plurality of power source voltages supplied to said semiconductor laser driver means is applied, and which have respective zener breakdown voltages corresponding to the minimum and maximum permissible values of said first one of said power source voltages, and second and third zener diodes, to which a second one of said power source voltages is applied, and which have respective zener breakdown voltages corresponding to the minimum and maximum permissible values of said second one of said power supply voltages; said means for emitting light includes first to fourth light-emitting elements connected in series with said respective first to fourth zener diodes; said means for photo-electrically converting includes first to third photo-electric conversion elements connected in series between a voltage supply terminal and a ground terminal, for receiving light from said respective first, third, and second light-emitting elements and a fourth photo-electric conversion element connected in parallel with said second photo-electric conversion element for receiving light from said fourth light-emitting element; and said control means includes a junction field-effect transistor with the gate thereof connected to a connection point between said second and third photo-electric conversion elements, and means for shunting said semiconductor laser according to the on-off operation of said junction field-effect transistor.

7. The semiconductor laser device according to claim 6, in which said first and second zener diodes and first to fourth light-emitting elements are connected in series with first current-limiting means, and said first to fourth photo-electric conversion elements are connected in series with second current-limiting means.

* * * * *

UNITED STATES PATENT AND TRADEMARK OFFICE
CERTIFICATE OF CORRECTION

PATENT NO. : 4,745,610
DATED : May 17, 1988
INVENTOR(S) : YOSHIKAWA

It is certified that error appears in the above-identified patent and that said Letters Patent is hereby corrected as shown below:

Title page, left-hand column, under "Foreign Patent Documents"

insert -- 0,140,175    8/1983    Japan    Konishi et al 0,142,987    11/1979    Japan    Chiyouno --

Signed and Sealed this

Twenty-fifth Day of April, 1989

Attest:

DONALD J. QUIGG

Attesting Officer

Commissioner of Patents and Trademarks